United States Patent [19]

Hayakawa et al.

[11] Patent Number: 4,492,928
[45] Date of Patent: Jan. 8, 1985

[54] COMB FILTER

[75] Inventors: Daishiro Hayakawa, Ashiya; Masao Akimoto, Neyagawa; Katsumi Narita, Neyagawa; Kenroku Tani, Katano, all of Japan

[73] Assignee: Matsushita Electric Industrial Co., Ltd., Kadoma, Japan

[21] Appl. No.: 272,919

[22] Filed: Jun. 12, 1981

[30] Foreign Application Priority Data

Jun. 23, 1980 [JP] Japan .................................. 55-85548

[51] Int. Cl.³ .......................... H03F 3/68; H04B 11/00
[52] U.S. Cl. ..................................... 330/126; 330/174; 330/306; 307/520; 328/167; 333/142
[58] Field of Search ............... 330/126, 174, 302, 306; 333/142, 143, 167; 307/520, 521, 522, 529; 328/167

[56] References Cited

U.S. PATENT DOCUMENTS 2,839,731 6/1958 McSkimin et al. .................... 333/30
4,350,956 9/1982 Depuy ................................ 328/167

FOREIGN PATENT DOCUMENTS 46-0462219 1/1971 Japan ..................................... 33/142

Primary Examiner—James B. Mullins
Attorney, Agent, or Firm—Cushman, Darby & Cushman

[57] ABSTRACT

Comb filter having a comb like band pass characteristic curve by using an ultrasonic delay line (9) is improved to reduce its size. An input signal is given through an impedance element 13 to a single terminal 10a of an improved delay line 9, wherein the single terminal serves as the input terminal and at the same time as the output terminal. Signals at both ends of the impedance element 13 are given to a mixing circuit 15 for summing or subtracting thereby. In the improved delay line 9, the ultrasonic wave radiated from the input terminal travels twice the conventional delay line and comes back to the original terminal, and thereby a sufficient propagation distance is obtainable in a small delay line.

10 Claims, 8 Drawing Figures

COMB FILTER

BACKGROUND OF THE INVENTION

1. Field of the Invention

The present invention relates to an improvement in a comb filter for use, for instance, to eliminate cross color (cross talks of color signals) of a video tape recorder or dot interference of NTSC color television receiver, etc.

2. Description of Prior Arts

An ultrasonic delay line delays electric signal for a predetermined time period. By utilizing the fact that the propagation velocity of the sonic wave in the delay line is about $10^{-5}$ of that of the electromagnetic wave, an electric signal is delayed by a process that the electric signal is transduced into the ultrasonic wave, and is given of a delay of several tens μsec to several hundreds μsec by the ultrasonic delay line, and thereafter is transduced back to the electric signal, thereby to produce a delayed electric signal.

FIG. 1 shows an example of conventional delay line, FIG. 2 shows an example of conventional comb filter utilizing the delay line of FIG. 1, and FIG. 3 is a diagram showing a characteristic curve of the conventional comb filter of FIG. 2.

An ultrasonic delay line 6 shown in FIG. 1 comprises a delay element 1 which is usually made with a glass block and the oblique corner face thereof has an input terminal comprising electrodes $2a$ and $2b$ with a piezoelectric element 3 inbetween and an output terminal comprising electrodes $2a'$ and $2b'$ with a piezoelectric element $3'$ inbetween. When an electric signal $E_i$ is applied across the input electrodes $2a$ and $2b$, the piezoelectric element 3 makes mechanical motion responding to the input signal $E_i$, thereby radiating an ultrasonic wave into the delay element 1. The ultrasonic wave propagates in the delay element 1 making a lot of reflections at the surface thereof as shown in FIG. 1, and reaches the electrode $2b'$. By receiving the ultrasonic wave at the electrode $2b'$, the piezoelectric element $3'$ is moved and produces electric output signal $E_o$ across the electrodes $2a'$ and $2b'$. Such delay lines have been used in comb filters for elimination of cross color of a video recorder signal or dot interference of an NTSC color television receiver.

FIG. 2 shows an example of conventional circuit construction of the comb filter using the delay line 6 shown in FIG. 1. A sinusoidal input signal $E_A$ applied to an input terminal 4 is given to the delay line 6 and an output signal of the delay line 6 is given to an input terminal $5b$ of a mixing circuit 5, and the sinusoidal input signal $E_A$ as such is applied to the other terminal $5a$ of the mixing circuit 5, which operates summing or subtraction of the input signals at the input terminals $5a$ and $5b$.

Provided that:
- $\omega$ is an angular frequency of the input signal $E_A$,
- $\alpha$ is a constant,
- $\beta$ is a constant, and
- $\tau_0$ is a delay time of the delay line 6, an output signal $E_C$ issued from the output terminal 7 of the circuit of FIG. 2 is given as $$E_C = E_A + E_B \quad (1)$$

$$= \alpha\sin\omega t + \beta\sin\omega(t - \tau_0)$$

$$= \sqrt{\alpha^2 + \beta^2 + 2\alpha\beta\cos\omega\tau_0} \cdot \sin(\omega t + \phi)$$

$$= A\sin(\omega t + \phi)$$

where:

$$\phi = \tan^{-1}\{\beta\sin\omega\tau_0/(\alpha + \beta\cos\tau_0)\} \text{ and}$$

$$A = \sqrt{\alpha^2 + \beta^2 + 2\alpha\beta\cos\omega\tau_0}.$$

Hereupon, it is provided that:

$A_{max}$ is a maximum value of the amplitude A,
$A_{min}$ is a minimum value of the amplitude A,
$\omega(n)_{max} = 2\pi f(n)_{max}$ is the angular frequency when the signal $E_C$ takes the value of $A_{max}$, and
$\omega(n)_{min} = 2\pi f(n)_{min}$ is the angular frequency when the signal $E_C$ takes the value of $A_{min}$;

then the following equations hold:

$$\left.\begin{array}{l}A_{max} = \alpha + \beta; \; \omega(n)_{max} = \dfrac{2n\pi}{\tau_0} \; (n = 0, 1, 2 \ldots), \text{ and} \\ \\ A_{min} = \alpha - \beta; \; \omega(n)_{min} = \dfrac{(2n+1)\pi}{\tau_0} \; (n = 0, 1, 2 \ldots).\end{array}\right\} \quad (2)$$

Then, the frequency pitch $f'_H$ between two neighboring $A_{max}$ and the frequency pitch $f''_H$ between two neighboring $A_{min}$ are given as follows:

$$\left.\begin{array}{l}f'_H = f(n+1)_{max} - f(n)_{max} = \dfrac{n+1}{\tau_0} - \dfrac{n}{\tau_0} = \dfrac{1}{\tau_0} \text{ and} \\ \\ f''_H = f(n+1)_{min} - f(n)_{min} = \dfrac{2n+3}{2\tau_0} - \dfrac{2n+1}{2\tau_0} = \dfrac{1}{\tau_0}.\end{array}\right\} \quad (3)$$

That is to say, by summing the original signal $E_A$ and a signal $E_B$ delayed by the time $\tau_0$ from the original signal $E_A$, the resultant signal $E_C$ has the repetitions of peaks and valleys of its spectrum distribution with the frequency pitches of $1/\tau_0$, and therefore band-path characteristic becomes comb-shaped as shown in FIG. 3, wherein the frequency pitches $f'_H$ and $f''_H$ are called comb pitches.

The abovementioned relation can be also deduced by Fourier transformation as follows:

Provided that a unit step function $\delta(t)$ is used as the input signal $E_A$, the delayed signal $E_B$ is given by $\delta(t - \tau_0)$, and accordingly the output signal $E_C(t)$ is given by:

$$E_C(t) = E_A + E_B \quad (4)$$

$$= \delta(t) + \delta(t - \tau_0).$$

By Fourier transformation of the equation (4), the following equation holds:

$$E_C(j\omega) = 1 + e^{-j\omega\tau_0} \quad (5).$$

Accordingly, the frequency characteristic of the output signal $E_C$ is given as follows:

$$E_C = E_C(j\omega) = \sqrt{(1 + \cos\omega\tau_0)^2 + \sin^2\omega\tau_0} \qquad (6)$$

$$= \sqrt{2(1 + \cos\omega\tau_0)} = \left| 2\cos\omega\frac{\tau_0}{2} \right|$$

$$= |2\cos\pi f\tau_0|.$$

The equation (6) shows that the comb filter of FIG. 2 has the comb shape characteristic having the frequency pitch of $1/\tau_0$.

The abovementioned conventional comb filter requires a certain size of the delay element block 1, and the size has been regarded particularly determined by the delay time $\tau_0$.

SUMMARY OF THE INVENTION

The present invention provides a comb-filter realized with a smaller sized delay element in comparison with that of the conventional comb filter. The reducing of the size of the delay element can be made by improved configuration of the circuit of the comb filter.

DESCRIPTION OF PREFERRED EMBODIMENT

A comb filter in accordance with the present invention comprises:

an ultrasonic delay line having a common terminal for inputting an ultrasonic signal therethrough in the delay line and at the same time taking out a delayed ultrasonic signal therethrough from the delay line, an impedance connected between a signal input terminal and the common terminal, a first amplifier circuit connected to an end of the impedance, a second amplifier circuit connected to the other end of the impedance, an operation circuit which provides summing of or subtraction between output signals of said first amplifier and said second amplifier to produce an output signal.

Figure 4:
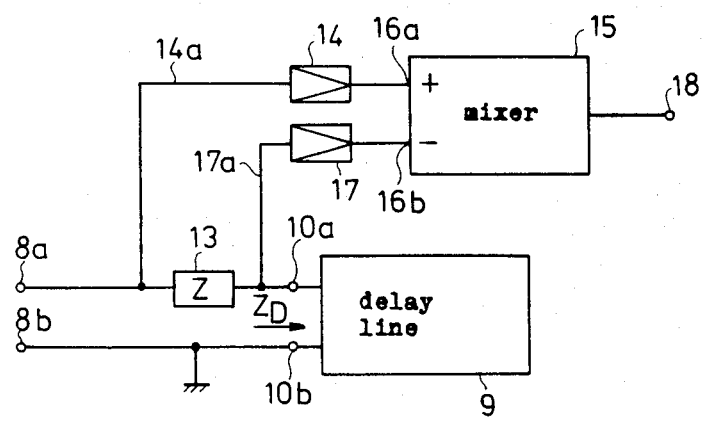
FIG. 4 is a block diagram showing a circuit configuration of a comb filter embodying the present invention.
Figure 5:
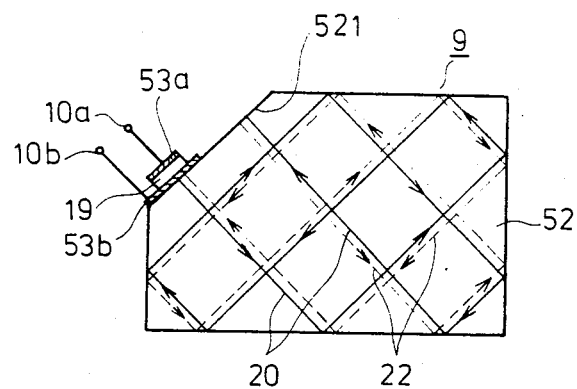
FIG. 5 is an elevation view of an example of a delay line embodying the present invention.

FIG. 4 is a block diagram showing an example of electric circuit structure of a comb filter embodying the present invention and FIG. 5 is an elevation view of a delay line 9 of the comb filter of FIG. 4.

In FIGS. 4 and 5, input terminals 8a and 8b are connected to the input terminals 10a and 10b of the ultrasonic delay line 9 through an impedance circuit 13 and directly, respectively. The input end of the impedance circuit 13 is connected through a first amplifier 14 as a buffer to a first input terminal 16a of a mixer 15 as an operation circuit. The output end of the impedance circuit 13 is connected through a second amplifier 17 as a buffer to a second input terminal 16b of the mixer 15. The input terminals 8a and 8b form input terminals of the comb filter of the present invention. The output terminal 18 of the mixer 15 forms an output terminal of the comb filter of the present invention.

The operation of the comb filter of FIG. 4 is elucidated as follows:

At first the impedance Z of the impedance circuit 13 is adjusted, for instance by adjusting a capacitance of its capacitor, in a manner to be equal to the input impedance $Z_D$ of the delay line 9 ($Z_D$ is the impedance seen rightwards from the input terminals 10a and 10b of the delay line 9). Then an input signal $\delta(t)$ is impressed across the input terminals 8a and 8b, and led to the amplifier 14 and to the impedance circuit 13. In the amplifier 14, the input signal $\delta(t)$ is amplified by $\alpha_1$ times thereby to give the input terminal 16a of the mixer 15 an output signal of $$\alpha_1 \delta(t) \qquad (11).$$

At the same time, since $Z = Z_D$, the second amplifier 17 receives a signal of $\frac{1}{2}\delta(t)$ from the junction point between the impedance circuit 13 and the delay line 9 through a line 17a. The amplifier 17 amplifies by $\alpha_2$ times the signal of $\frac{1}{2}\delta(t)$ and gives the input terminal 16b of the mixer 15 the amplified output signal of $$\tfrac{1}{2}\alpha_2 \delta(t) \qquad (12).$$

On the other hand, since $Z = Z_D$, the input terminals 10a and 10b of the delay line 9 receive the signal of $\frac{1}{2}\delta(t)$, which actuates the piezoelectric element 19 between the electrodes 53a and 53b. That is, the signal of $\frac{1}{2}\delta(t)$ is electromagnetically transformed to an ultrasonic wave, which is radiated into and propagates in the delay element 52, along a path as shown by the solid arrow lines reflected many times, and reaches the reflection face 521. The ultrasonic wave is reflected by the reflection face 521 and travels back on the same path but in the inverse direction, namely travelling round trip, as shown by the dotted arrow lines, and reaches the electrode 53b. Thereby, the electrode 53b and the piezoelectric element 19 are actuated and the latter generates the following electric signal $E_D$ across the electrodes 53a and 53b:

$$E_D = \frac{1}{2}\delta(t - \tau_1)k \cdot e^{-2l} \qquad (13)$$

$$= \frac{k}{2} \cdot e^{-2l} \cdot \delta(t - \tau_1),$$

where:

$\tau_1$ is a delay time for round trip from the electrode 53b through the reflection face 521 and back to the electrode 53b, l is a total length of the path from the electrode 53b to the reflection face 521 or vice versa, and k is a reflection coefficient of the reflection at the reflection face 521.

The output signal of the delay line 9 from the terminal 10a is led through the lead wire 17a to the amplifier 17, and amplified by $\alpha_2$ times, thereby giving the input terminal 16b the signal of $$(a2/2)k \cdot e^{-2l} \delta(t-\tau_1) \quad (14)$$

As has been described above, the mixer 15 receives the signal of expression (11) at the input terminal 16a and the signals of expressions (12) and (14) at the input terminal 16b. The mixer 15 operates subtraction between the signal to the input terminal 16a and the signals to the input terminal 16b, and produces the following resultant signal $E_C(t)$:

$E_C(t) =$ signal of eq. (11) − (signals of eq. (12) and eq. (14)) = (15)

signal of eq. (11) − signal of eq. (12) − signal of eq. (14)

$$= a_1 \delta(t) - \frac{1}{2} a_2 \delta(t) - \frac{a2}{2} k \cdot e^{-2l} \delta(t-\tau_1)$$

$$= \left(a_1 - \frac{a2}{2}\right) \delta(t) - \frac{a2}{2} k \cdot e^{-2l} \delta(t-\tau_1).$$

Then, the amplifiers 14 and 17 are adjusted in a manner that their amplification factors $a_1$ and $a_2$ fulfil the following equation (16):

$$a_1 - a2/2 = -a2/2 k \cdot e^{-2l} = A \quad (16).$$

As a result, the following relation (17) holds:

$$E_C(t) = A[\delta(t) + \delta(t-\tau_1)] \quad (17),$$

where $$a_2 = \frac{2}{1 - k \cdot e^{-2l}} \cdot a_1,$$

and $$A = \frac{k \cdot e^{-2l}}{1 - k \cdot e^{-2l}} \cdot a_1.$$

From the abovementioned equation (17), by means of the Fourier transformation, the frequency characteristic of the output signal $E_C$ at the output terminal 18 of the comb filter is given by $$E_C = |E(j\omega)| = |2A \cos \omega \tau 1/2| = |2 \cos \pi f \tau_1| \quad (18)$$

Figure 2:
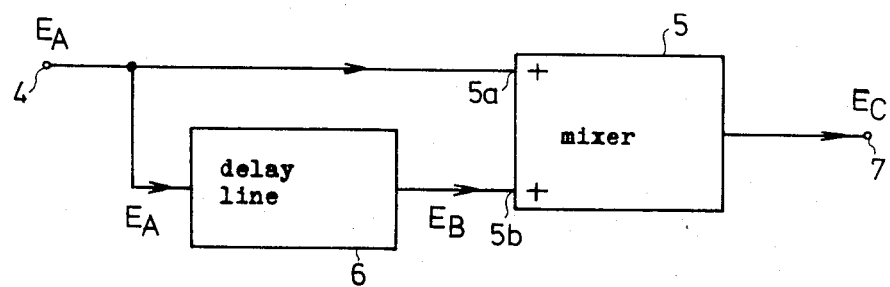
FIG. 2 is the block diagram showing circuit configuration of the comb filter employing the delay line of FIG. 1.
Figure 3:
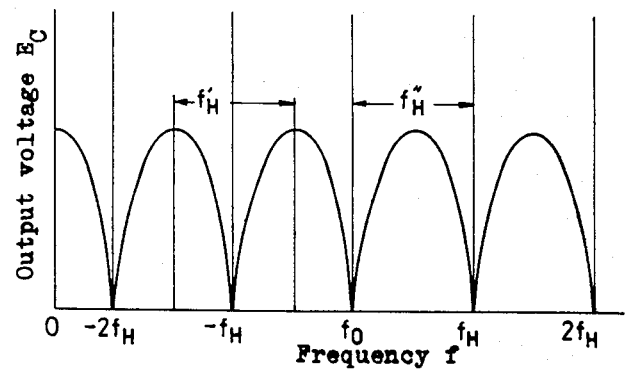
FIG. 3 is a diagram showing frequency characteristic curve of comb filter of FIG. 2.

The frequency characteristic of the equation (18) is identical to that shown by the equation (6) for the conventional comb filter of FIG. 2.

Figure 6:
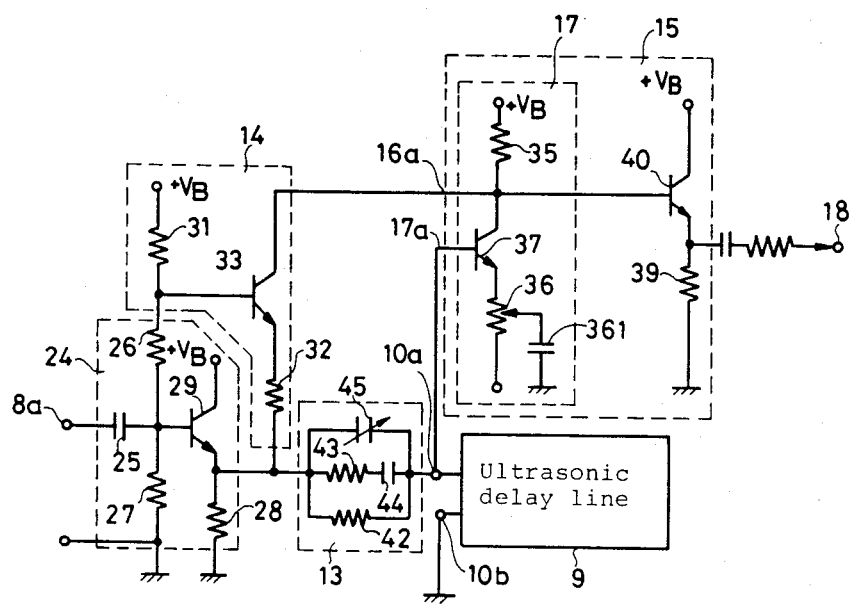
FIG. 6 is a detailed circuit diagram showing the circuit of a comb filter embodying the present invention.

FIG. 6 shows a detailed circuit construction of the comb filter elucidated referring to FIGS. 4 and 5. In the circuit of FIG. 6, an impedance matching circuit 24 comprises a capacitor 25, resistors 26, 27 and 28 and a transistor 29. The amplifier 14 comprises a transistor 33 and resistors 31 and 32 and has the amplfication factor $a_1$. The amplifier 17 comprises a transistor 37, resistor 35 a capacitor 361 and a potentiometer 36 which is for adjusting the amplification factor $a_2$. The mixer circuit 15 comprises the amplifier 17, a transistor 40 and a resistor 39 and serves as an operation circuit. The variable impedance circuit 13 comprises resistors 42, 43 capacitor 44 and a variable capacitor 45. The ultrasonic delay line 9 has only common electrode 10a and 10b, which is for inputting and outputting. In this actual circuit configuration, the transistor 37 works as the transistor of the amplifier 17 and also as an active element of the mixer circuit 15.

Figure 1:
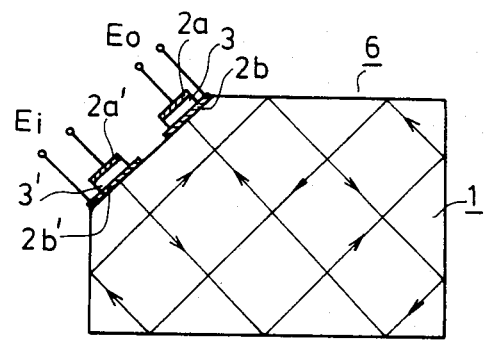
FIG. 1 is the elevation view of an example of a delay line of a conventional comb filter.
Figure 7:
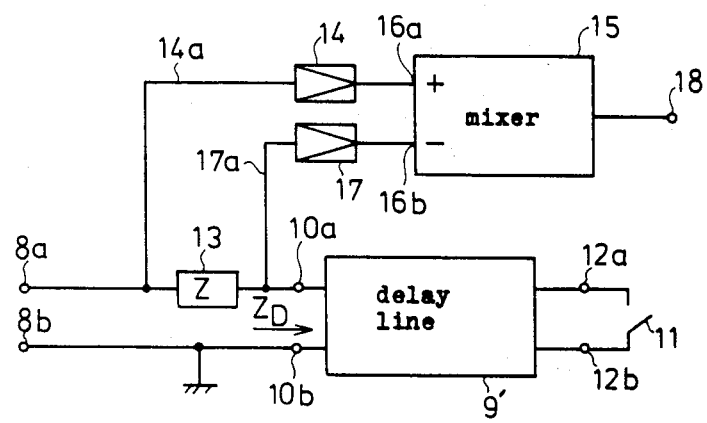
FIG. 7 is a block diagram of a modified comb filter embodying the present invention.
Figure 8:
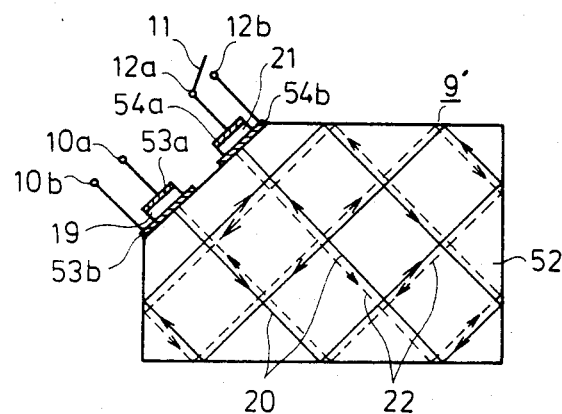
FIG. 8 is an elevation view of a modified example of a delay line embodying the present invention.

FIG. 7 is a circuit diagram of a modified example of a comb filter embodying the present invention and FIG. 8 is an elevation view of a delay line 9' used in the comb filter of FIG. 7. The embodiment is almost the same as that of FIGS. 4, 5 and 6, but only difference is that the delay line 9' is slightly different from that 9 of FIGS. 4 to 6. That is, the delay line 9' of this modified example of FIGS. 7 and 8 is provided with a second set of electrodes 54a and 54b with a piezoelectric element 21 inbetween, wherein the electrode 54b is at the reflection face 521. That is, the configuration of the ultrasonic delay line 9' is similar to that (6) of the conventional one shown in FIG. 1. However, an adjustment switch 11 is provided across the electrodes 54a and 54b so as to short-circuit or open them. By means of such switching of the switch 11, acoustic or mechanical characteristic of the piezoelectric element can be varied, and therefore, the delay time can be adjusted, and therefore the comb pitch $f'_H$ and $f''_H$ can be varied. The actual circuit configuration may be the same as of FIG. 6, except the change of numeral 9 to 9' for the delay line which comprises the second terminals 12a and 12b and switch 11.

As has been elucidated in detail with respect to the embodiments, in the comb filter in accordance with the present invention, the delay line block 52 of smaller size than the corresponding conventional one can give the same delay time. And therefore, by adopting the new circuit configuration of FIG. 4 or 7, the small size delay line 9 or 9' can be utilized, thereby reducing the size of the over-all comb filter.

What is claimed is:

1. A comb filter comprising
   an ultrasonic delay line element having a common terminal for inputting an ultrasonic signal therethrough in said delay line and at the same time taking a delayed ultrasonic signal therethrough out of said delay line,
   an impedance element connected between a signal input terminal and said common terminal,
   a first amplifier circuit connected to an end of the impedance element,
   a second amplifier circuit connected to the other end of the impedance element,
   an operation circuit which provides summing of or subtraction between output signals of said first amplifier and said second amplifier to produce an output signal.

2. A comb filter in accordance with claim 1, wherein said impedance element is a variable impedance.

3. A comb filter in accordance with claim 1, wherein said delay line element comprises a glass block wherein, at a predetermined part thereon, a ground electrode, a piezoelectric element and an electrode connected to said common terminal are disposed in this order.

4. A comb filter in accordance with claim 3, wherein said delay line element further comprises, at another predetermined part thereon, another ground electrode, another piezoelectric element and still another electrode disposed in this order, and a switch for shortcircuiting said another ground electrode and said another electrode.

5. A comb filter comprising:
   an ultrasonic delay line element of a glass block provided with a common terminal for inputting an ultrasonic signal therethrough in said delay line and at the same time taking a delayed ultrasonic signal therethrough out of said delay line;

an impedance element connected between a signal input terminal and said common terminal;

a first amplifier circuit connected to an end of the impedance element;

a second amplifier circuit connected to the other end of the impedance element; and an operation circuit which provides summing of or subtraction between output signals of said first amplifier and said second amplifier to produce an output signal.

6. A comb filter in accordance with claim 5, wherein said impedance element is a variable impedance.

7. A comb filter in accordance with claim 5, wherein said delay line element comprises a glass block whereon, at a predetermined part thereon, a ground electrode, a piezoelectric element and an electrode connected to said common terminal are disposed in this order, and further comprises, at another predetermined part thereon, another ground electrode, another piezoelectric element and still another electrode disposed in this order, and a switch for short circuiting said another ground electrode and said another electrode.

8. A comb filter comprising:

an ultrasonic delay line element having a common terminal for inputting an ultrasonic signal therethrough in said delay line and at the same time taking a delayed ultrasonic signal therethrough out of said delay line, an impedance element connected between a signal input terminal and said common terminal;

a first amplifier circuit connected to an end of the impedance element;

a second amplifier circuit connected to the other end of the impedance element;

an operation circuit which provides summing of or subtraction between output signals of said first amplifier and said second amplifier to produce an output signal; and wherein said delay line element comprises a glass block whereon, at a predetermined part thereon, a ground electrode, a piezoelectric element and an electrode connected to said common terminal are disposed in this order.

9. A comb filter in accordance with claim 8, wherein said impedance element is a variable impedance.

10. A comb filter in accordance with claim 8, wherein said delay line element further comprises, at another predetermined part thereon, another ground electrode, another piezoelectric element and still another electrode disposed in this order, and a switch for short circuiting said another ground electrode and said another electrode.

* * * * *